United States Patent [19]
Sato et al.

[11] Patent Number: 5,365,537
[45] Date of Patent: Nov. 15, 1994

[54] METHOD OF PRODUCING A SEMICONDUCTOR LASER

[75] Inventors: Kiyotaka Sato; Kenji Togura, both of Fukushima, Japan

[73] Assignee: Clarion Co., Ltd., Tokyo, Japan

[21] Appl. No.: 1,462

[22] Filed: Jan. 7, 1993

[51] Int. Cl.$^5$ .............................................. H01S 3/19
[52] U.S. Cl. ...................................... 372/50; 372/45; 372/46
[58] Field of Search .............................. 372/45, 46, 50

[56] References Cited

U.S. PATENT DOCUMENTS

| | | | |
|---|---|---|---|
| 4,760,578 | 7/1988 | Oshima et al. | 372/45 |
| 4,869,780 | 9/1989 | Yang et al. | 372/50 |
| 4,881,237 | 11/1989 | Donnelly | 372/50 |
| 5,001,719 | 3/1991 | Trussell | 372/50 |
| 5,012,477 | 4/1991 | Mesquida et al. | 372/50 |
| 5,070,511 | 12/1991 | Kappeler et al. | 372/50 |
| 5,159,603 | 10/1992 | Kim | 372/45 |

Primary Examiner—Georgia Y. Epps
Attorney, Agent, or Firm—Koda and Androlia

[57] ABSTRACT

A semiconductor substrate is coated with an insulation mask. A window is cut in the mask using photolithography leaving stress risers at locations defining the length of a laser cavity. A plurality of layers of semiconductor film are selectively grown over the exposed substrate to form a pin diode and necessary impurities are injected. An intrinsic layer of the film forms a laser excitation layer and emits laser beams in response to excitation. Following heat treatment, the device is cooled rapidly, causing stress in the areas where the stress risers from the mask join the semiconductor film. By the time the device reaches room temperature, the semiconductor film is split and separated by cleavage planes. Alignment of the semiconductor laser device output beams is produced by anisotropic etching of the cleavage planes to form 45° mirror planes. Conventional photolithographic techniques permit formation of the laser resonator with an accuracy on the order of submicrons.

13 Claims, 7 Drawing Sheets

FIG. 4
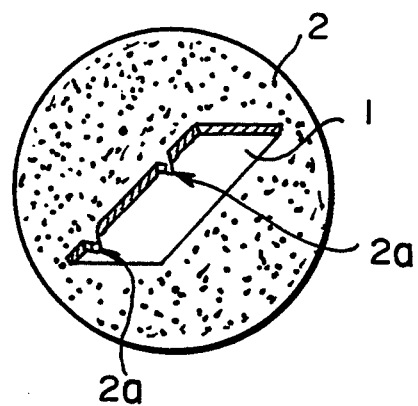
FIG. 5(a)  FIG. 5(b)  FIG. 5(c)
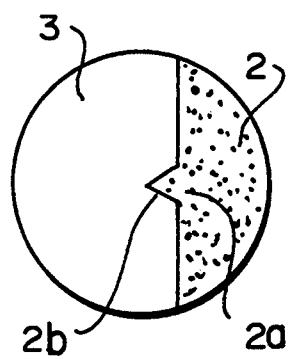 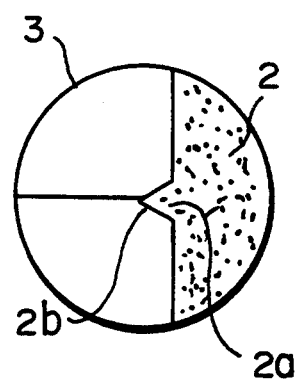 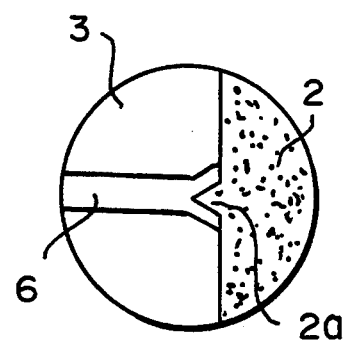

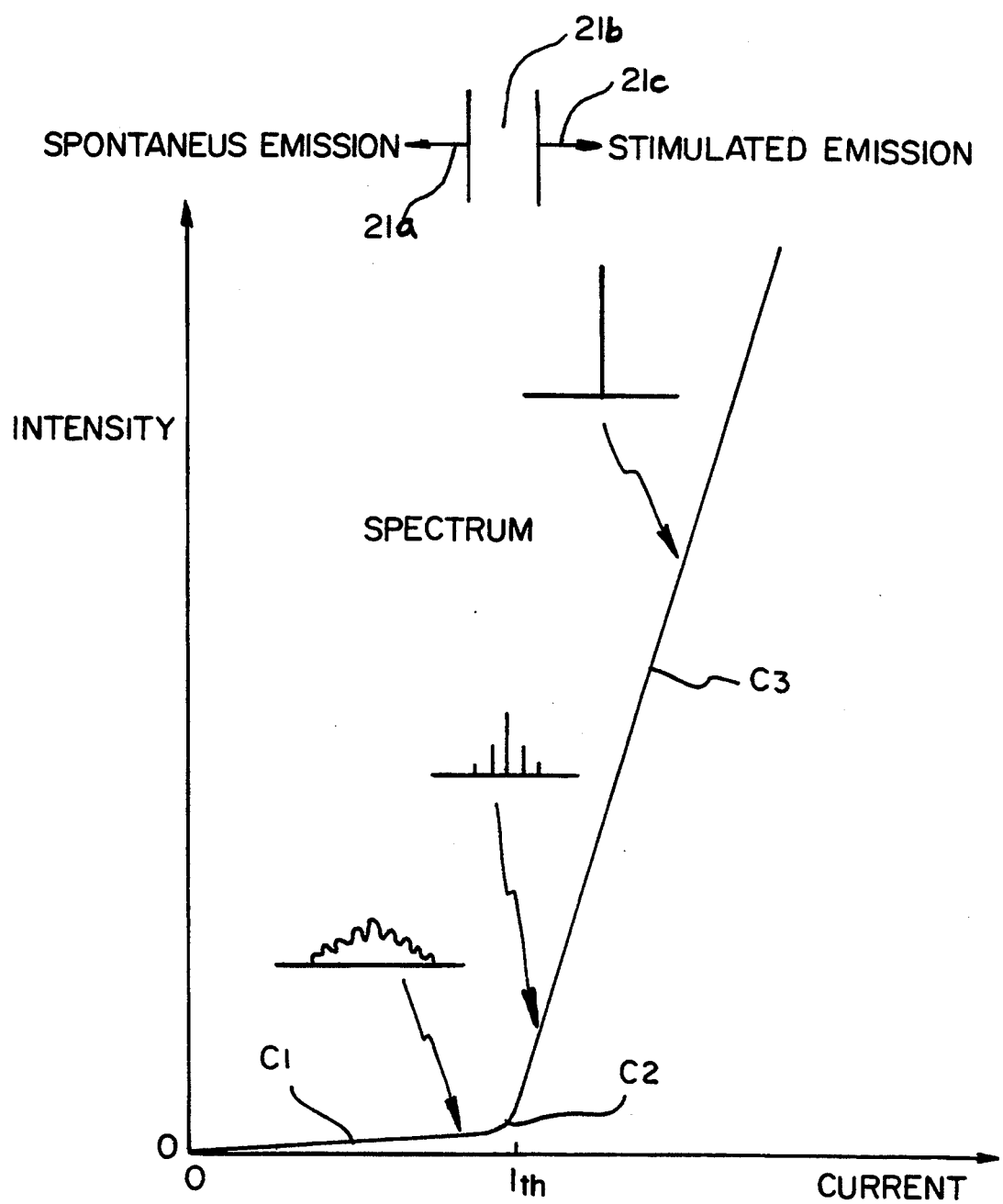

METHOD OF PRODUCING A SEMICONDUCTOR LASER

BACKGROUND OF THE INVENTION

The present invention relates generally to an improved method for producing a semiconductor laser device.

Opto-electronic integrated circuits (OEIC) consist of optical devices such as optical switches, branching filters/collectors, light detectors/emitters, etc., integrated on the same substrate with electronic circuits such as amplifying circuits for photodetectors, driving circuits for light emitters and discriminator decision circuits. Research in integrating electronic circuits and optical elements by epitaxially growing luminescent material such as GaAs on a silicon substrate is actively pursued.

The nucleus of an OEIC semiconductor laser device's light emitter is its resonator. Difficulties with the conventional method of fabricating OEIC's arise from the fact that the mirror surfaces of the resonator are cleavage surfaces of crystal. Since the cleavage surfaces undesirably penetrate the underlying substrate, the length of the OEIC resonator is limited with respect to the integration of electronic components.

A further technique in the prior art is chemical and dry etching commonly used to form the mirror surfaces of resonators. These methods are inherently undesirable, however, since they may damage the mirror surfaces and are not as accurate as cleavage methods, which are capable of creating mirror surfaces with dimensions on the order of submicrons.

A two-dimensional array of a semiconductor laser device can be formed on an OEIC by guiding laser beams in a specified direction, including right angles, off the surface of an epitaxial film. Since the cleavage surfaces in conventional devices penetrate the substrate, however, arrays cannot be constructed.

A method for emitting a laser beam perpendicular to the epitaxial surface via a 45 degree mirror monolithically formed through etching is known in the art. To form the required resonator, however, a complicated two step process is required. First, both ends of the resonator are formed using mirror-surface etching at right angles to the substrate. Second, the mirror planes are formed through anisotropic etching at a 45° angle to the substrate. Taking the spatial arrangement and attenuation of a laser beam into consideration, the distance between the resonator surface and the mirror planes must be minimized. The two step etching process of the prior art, however, forms a relatively large gap between the end of the resonator and the mirror plane.

Objects and Summary of the Invention

It is an object of the present invention to provide a method for forming a semiconductor laser device which overcomes the drawbacks of the prior art.

It is a further object of the present invention to provide a method for producing an array of high-performance semiconductor lasers on an OEIC, with each semiconductor laser device having mirror planes at both ends of each resonator.

A method for producing a semiconductor laser device according to the present invention is accomplished by forming a mask on a semiconductor substrate. A window is cut from the mask using photolithography, leaving wedge shaped projections, or stress risers, at points along the mask which mark the length of the laser cavity. Several layers of epitaxial film are grown on the exposed substrate and incorporate the stress risers. The layers are doped with impurities so as to form a pin diode, where the intrinsic layer forms a laser excitation layer that generates laser beams when electrically excited beyond a threshold level. The use of a pin diode achieves a high gain for laser light generation.

In order to lower the threshold current level of the laser excitation layer, a diffused layer can be formed in the film. The diffused layer increases the current density of the film, thereby decreasing the threshold current level. A diffused layer can be formed by applying a resist over selected portions of the film, and injecting impurities into exposed areas of the film through ion implantation. Heat treatment activates the impurities to form the diffusion layer.

Following heat treatment, the device is cooled rapidly. The sudden drop in temperature causes stress to concentrate in the areas of the film which join the stress risers. Cleavages begin forming in the epitaxial film. By the time the film reaches room temperature, the film has split along the stress risers defining a resonator section therebetween. Regions outside the resonator section are used to form angled mirror planes for reflecting the laser output from the laser resonator outward from the substrate.

Once the film has split, resist is applied over the entire surface of the device, except for selected areas of the separated portions. Mirror planes are formed by anisotopically etching the exposed selected areas. Once the etching is completed, the resist is removed and metal contact layers are deposited on the top of the film and the bottom of the substrate.

A semiconductor laser device produced according to the above method operates by conducting an electric current between the metal contact layers through the resonator and substrate. A laser excitation layer of the resonator is energized electrically beyond a threshold current level to generate the laser beams. The beams exit in opposite directions through the resonator surfaces and reflect off the mirror surfaces as output beams. If only one beam is desired, one side of the resonator can be covered with a metal to block laser emissions.

Briefly stated, the present invention provides a semiconductor laser device formed by coating a substrate with an insulation mask. A window is cut in the mask using photolithography leaving stress risers at locations corresponding to the length of the laser cavity. Several layers of semiconductor film are selectively grown over the exposed substrate and any necessary impurities are injected. Following heat treatment, the device is rapidly cooled, causing stress in the areas where the stress risers from the mask join the semiconductor film. By the time the device reaches room temperature, the semiconductor film is split by cleavages which separate the film into two separated portions and a resonator. Alignment of the semiconductor laser device input and output directions is produced by isotropic etching of the separated portions to form 45° mirror planes. Since photolithography is employed, the cavity of the resonator of a semiconductor laser device can be made accurate to the submicron order. The laser emits beams out of the sides of both ends of the resonator when electric current beyond a threshold level flows through the film and reflects off the angled mirror planes.

According to an embodiment of the present invention, there is provided a method for producing a semiconductor laser device comprising: forming a mask on a semiconductor substrate, removing a window from said mask for exposing a portion of said substrate and leaving at least one stress riser, growing a semiconductor film having a plurality of layers over said portion of said substrate in said window, at least one of said plurality of layers being effective to form a laser excitation layer, and cooling said semiconductor film at a cooling rate effective to cause fracture of said semiconductor film at said at least one stress riser for forming a cleavage in said film, wherein said cleavage splits said film into at least first and second portions.

According to a feature of the above embodiment of the present invention, there is provided a method for producing a semiconductor laser device comprising: forming a mask on a semiconductor substrate, cutting a window out of said mask for exposing a part of a surface of said substrate, the step of removing including leaving first and second stress risers at locations defining a cavity length of a laser resonator of said laser, forming a semiconductor film having a plurality of layers over said exposed portion of said substrate in said window, at least one of said plurality of layers being a layer that forms a laser excitation layer, cooling said semiconductor film at a rate effective to fracture said semiconductor film at said stress risers for forming first and second cleavages in said film corresponding to said first and second stress risers and splitting said film into first, second and third portions, said second portion being a resonator between said first and third portions.

According to a further feature of the above embodiment of the present invention, there is provided a method for producing a semiconductor laser device comprising: growing a semiconductor film having a plurality of layers on a substrate, said growing including forming at least first and second stress risers in an edge thereof, spacing apart said first and second stress risers a distance defining a cavity length of a laser, said plurality of layers including a laser excitation layer, cooling said semiconductor film at a rate effective to fracture said semiconductor film at said stress risers for forming first and second cleavages in said film corresponding to said first and second stress risers and splitting said film into first, second and third portions, said second portion defining a laser resonator between said first and third portions, said laser resonator having first and second sides effective for emitting at least one laser beam from said laser excitation layer in response to excitation of said film, and isotopically etching at least one of said first and third portions to form at least one mirror plane at an angle to said substrate effective to reflect said at least one laser beam.

According to second embodiment of the present invention, there is provided a semiconductor laser device comprising: a substrate, a semiconductor film on said substrate having a plurality of layers, said plurality of layers having a laser excitation layer, first and second cleaved ends in said semiconductor film, said first and second cleaved ends being parallel to each other and spaced apart a distance effective to define a resonator for permitting laser activity within said semiconductor film, said laser excitation layer being effective for emitting at least one beam from said first and second cleaved ends in response to an excitation, respectively, at least one separated portion of said semiconductor film on said substrate, a mirror plane on said at least one separated portion facing one of said first and second cleaved ends, respectively, said mirror plane being disposed at an angle with respect to a line perpendicular to said first and second cleaved ends, said angle being effective for reflecting said at least one beam between said line and a location off said substrate in a desired direction, and means for exciting said laser excitation layer.

According to a feature of the second embodiment of the present invention, there is provided a semiconductor laser device comprising: a substrate, a resonator disposed on said substrate and having a plurality of layers, said resonator having a laser excitation layer for emitting a beam an angular mirror plane on said substrate for reflecting said beam, and means for exciting said laser excitation layer.

According to a further feature of the second embodiment of the present invention, there is provided a semiconductor laser device comprising: a substrate, a resonator disposed on said substrate having a laser oscillator between first and second sides of said resonator, said laser oscillator being effective for emitting at least one of first and second beams from said first and second sides of said resonator, respectively, at least one of first and second angular mirror planes on said substrate for reflecting said at least one of first and second beams, respectively, and means for exciting said laser oscillator.

According to a still further feature of the second embodiment of the invention, there is provided a semiconductor laser device comprising: a substrate, a semiconductor film on said substrate having a plurality of layers effective for forming a pin diode having an intrinsic layer that forms a laser excitation layer, said laser excitation layer being effective for producing at least one beam of light, means for causing first and second stress risers in said film wherein said stress risers define a cavity length of said laser, said film including means for fracturing at said stress risers in response to rapid cooling to first, second and third portions, said first and second portions being separated by a first cleavage, said second and third portions being separated by a second cleavage, said second portion being a laser resonator defined by first and second cleavage planes at ends thereof, etched first and second mirror planes on said first and third portions facing said first and second cleavage planes, respectively for reflecting said at least one beam of light, and said resonator being disposed between said first and second mirror planes such that said at least one beam of light emitted from said laser excitation layer reflects off one of said first and second mirror planes.

According to a third embodiment of the present invention, there is provided an intermediate product of a semiconductor laser device comprising: a substrate, a mask on a semiconductor substrate having a window for exposing a portion of said substrate, at least one stress riser in said window, a semiconductor film over said window in contact with said at least one stress riser, and said at least one stress riser being effective for fracturing said semiconductor film during rapid cooling.

According to a fourth embodiment of the invention, there is provided a method for producing an intermediate product useful for producing a semiconductor laser device, comprising: forming a mask on a semiconductor substrate, cutting a window out of said mask for exposing a portion of said substrate and leaving at least one stress riser in an edge of said window, growing a semiconductor film having a plurality of layers over said portion of said substrate in said window in contact with said at least one stress riser, and said semiconductor film having a property effective to produce a fracture forming a cleavage plane at said at least one stress riser during rapid cooling thereof.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 4 is a perspective view of a window cut in an insulating mask covering the substrate.

FIGS. 5(a)–5(c) are enlarged views showing the area labeled "R" in FIG. 1.

FIG. 6 is a diagram showing the relationship between input current and laser output.

DETAILED DESCRIPTION OF THE PREFERRED EMBODIMENT

Figure 1A:
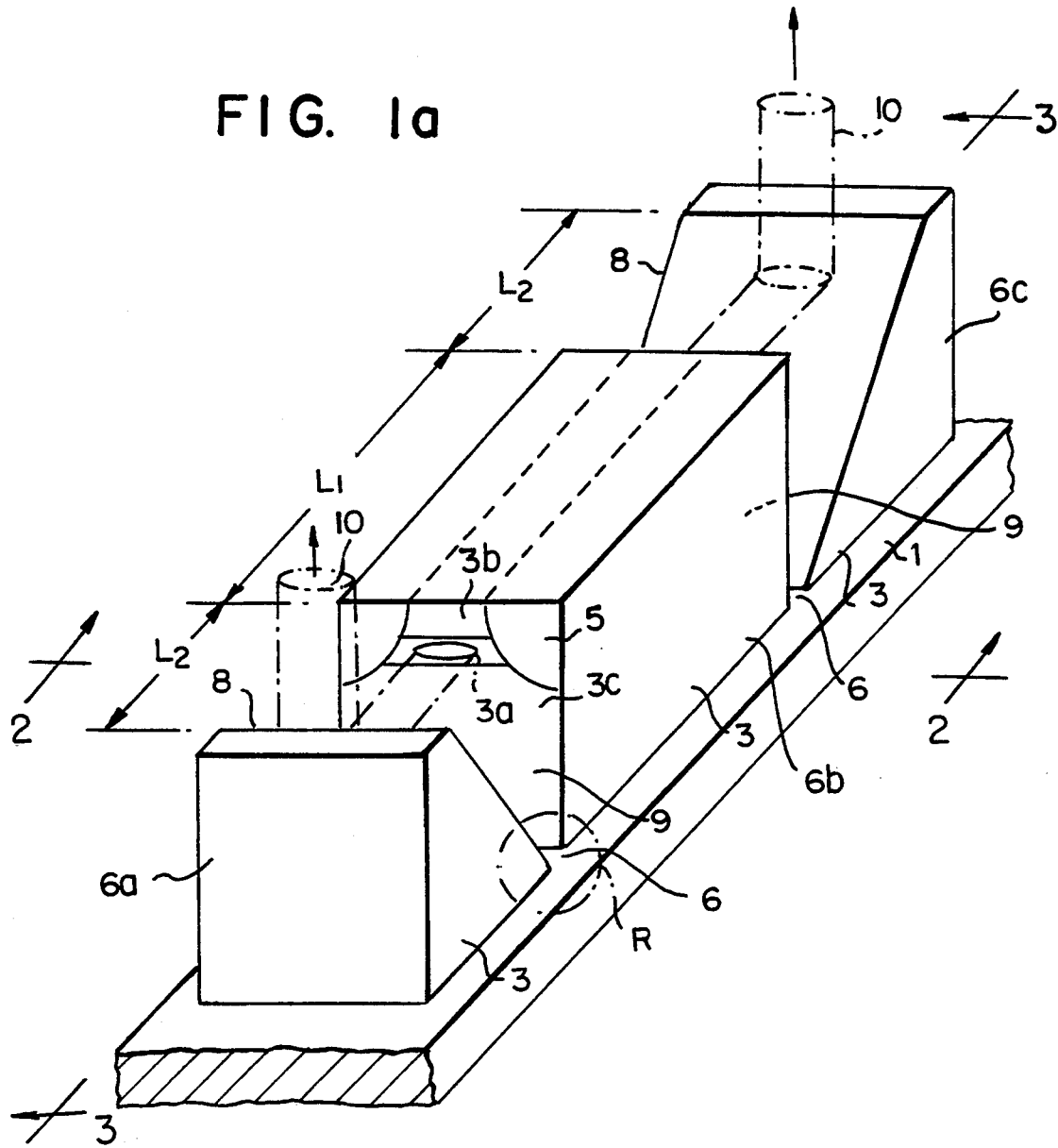
FIG. 1a is a perspective view of a semiconductor laser device according to a preferred embodiment of the present invention.

Referring to FIG. 1a, a basic structure of a device according to the present invention will be described hereinafter. A substrate 1 supports mirror planes 8 formed on separated portions 6a and 6c, and a resonator 6b located therebetween. Resonator 6b and separated portions 6a and 6c are separated at the base thereof by cleavages 6 and at the top thereof by a distance $L_2$. Resonating surfaces 9 of resonator 6b, which are parallel to each other, are spaced apart by a distance $L_1$ to allow laser excitation therein. The resonator contains a laser excitation layer 3a, a top layer 3b, and a bottom layer 3c. In the preferred embodiment of the invention, these layers form a pin diode. By electrically exciting top layer 3b, a pair of laser beams 10 are emitted from laser excitation layer 3a which reflect off mirror planes 8, which are formed on the separated portions 6a and 6c, respectively.

Figure 1B:
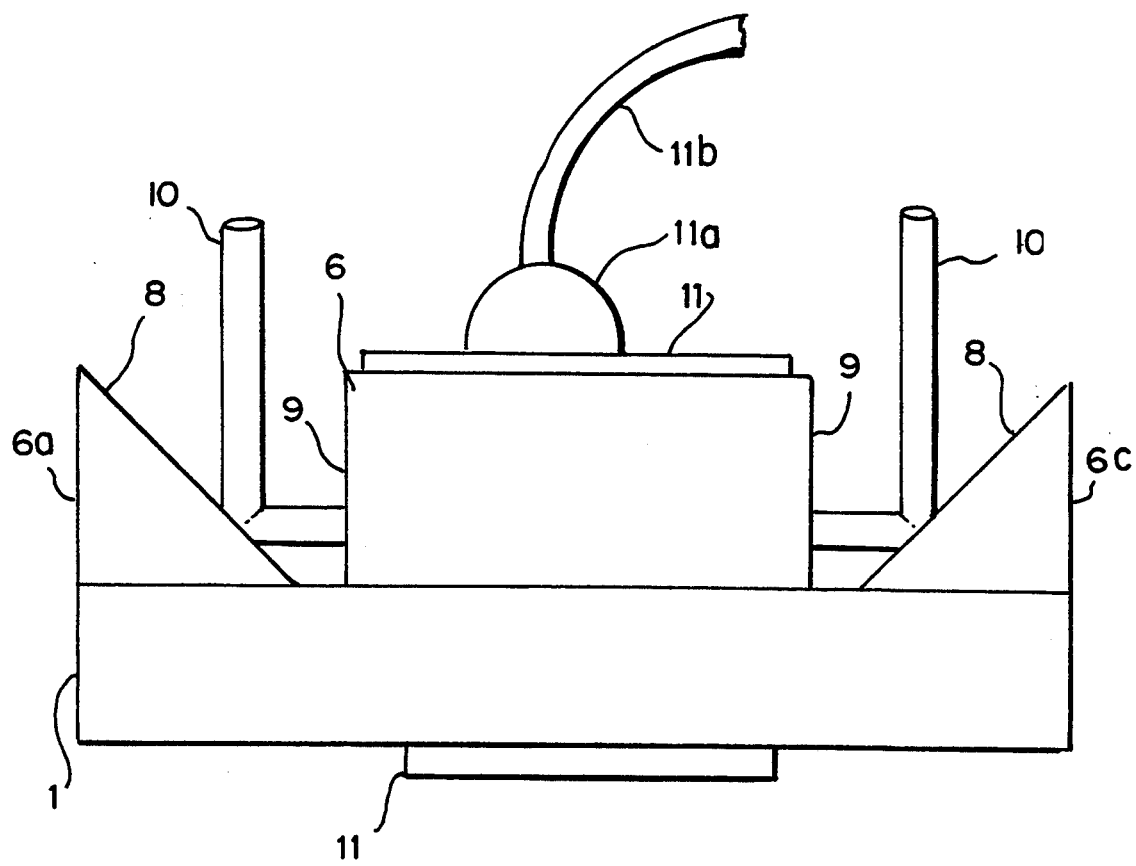
FIG. 1b is a side view of the semiconductor laser device of FIG. 1.

FIG. 1b illustrates a side view of a semiconductor laser device produced through the above-described process. Ohmic contacts are formed using conventional methods on the top of resonator 6b as well as the bottom of substrate 1 to form a metal electrode 11. A wire 11b is connected to metal electrode 11 via a wire bonding electrode 11a. Wire 11b is connected to an external power supply (not shown) to supply electric current for exciting resonator 6b.

Figure 2A:
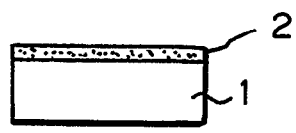
FIGS. 2(a)–2(g) are cross sectional vies taken along line 2—2 in FIG. 1 showing successive steps of the fabrication process.
Figure 3A:
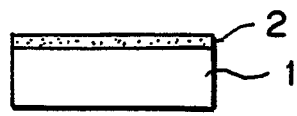
FIGS. 3(a)–3(h) are cross sectional process drawings taken along 3—3 in FIG. 1 showing steps of the fabrication process.

Referring to FIGS. 2(a) and 3(a), a $SiO_2$ insulating mask 2 is formed on silicon substrate 1.

Figure 2D:
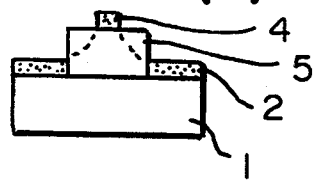
Figure 2B:
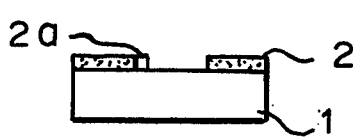
Figure 3E:
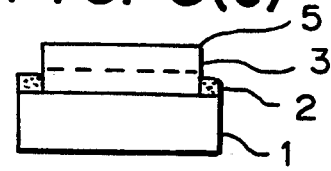
Figure 3B:
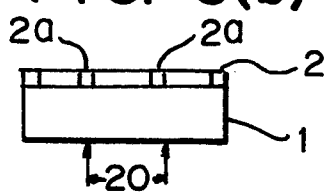

Referring now to FIGS. 2(b) and 3(b), a portion of mask 2 is selectively cut and removed using, for example, photolithography, including exposure and etching, to form a window through which the upper surface of substrate 1 is exposed. Referring now also to FIG. 4, the formed window has two wedge-shaped stress risers 2a located along an edge thereof. These stress risers define a cavity length 20 of resonator 6b and will cause cleavages to form during subsequent processing.

Figure 2E:
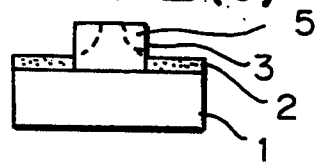
Figure 2C:
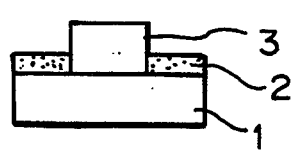
Figure 2F:
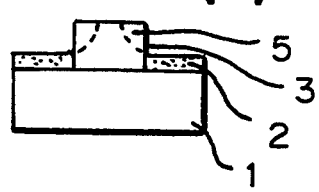
Figure 3F:
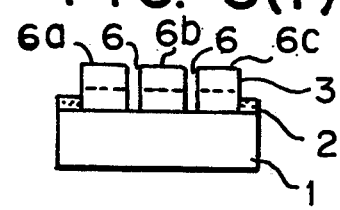
Figure 3C:
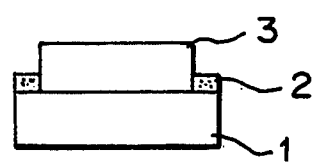

Referring now to FIGS. 2(c) and 3(c), and 5(a) several layers of a semiconductor film 3 of GaAs and AlGaAs are heteroepitaxially grown on the exposed portion of substrate 1 using MOCVD (Metal Organic Chemical Vapor Deposition) at a reduced pressure and a temperature ranging from 600 to 700 degrees C. Film 3 forms around the contours of the window in mask 2, including indented regions 2b where film 3 joins stress risers 2a.

In some lasers it is desirable for film 3 to have a diffusion layer, which serves to increase the current density of laser excitation layer 3a, and lowers the required threshold current.

Figure 3G:
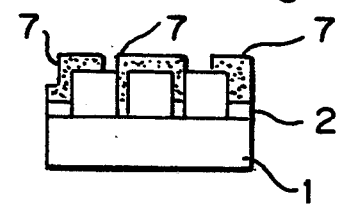
Figure 3D:
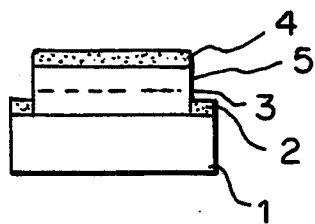

Referring now to FIGS. 2(d) and 3(d), a diffusion layer 5 is formed by applying a photoresist 4 on a portion of film 3 and injecting impurities into the exposed areas using ion implantation.

Referring now to FIGS. 2(e) and 3(e), photoresist 4 is removed and diffusion layer 5 is formed by activating the impurities through Rapid Thermal Annealing or other similar methods.

Figure 2G:
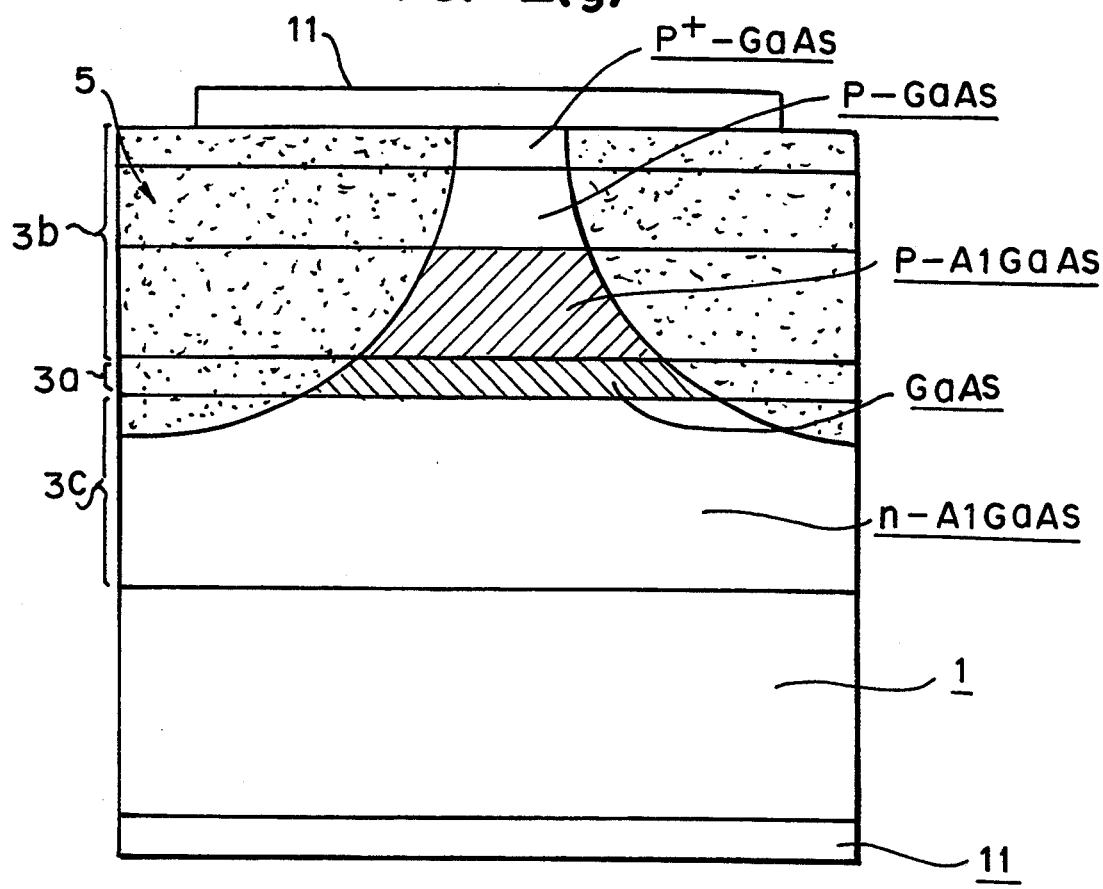

Referring now to FIG. 2(g), the individual layers of film 3 are stratified to form a laser excitation layer 3a, a top layer 3b, and a bottom layer 3c. In the preferred embodiment of the invention, top layer 3b is a p-type layer, the laser excitation layer 3a is intrinsic material, and bottom layer 3c is n-type. The result is a pin diode that achieves a higher gain for the laser.

FIG. 2(g) illustrates an example of the preferred embodiment of the laser. Bottom layer 3c is an n type AlGaAs. Laser excitation layer 3a is an undoped region of GaAs. Top layer 3b consists of a first layer of p type AlGaAs, a second layer of p type GaAs, and a third layer of p+ type GaAs. The result is a pin diode. By electrically exciting resonator 6b by means of an electric current beyond a threshold level, laser beams 10 are emitted from laser excitation layer 3a.

Referring now to FIGS. 2(f), 3(f) and 5(a)–5(c), the entire device, that is, film 3 and substrate 1 on which film 3 is formed, is rapidly cooled after heat treatment. As the temperature drops, stress develops in film 3, concentrating at stress risers 2a. Due to the difference in the coefficients of thermal expansion, cleavages 6 begin to form at stress risers 2a. When the temperature of the device reaches room temperature, film 3 has separated into separated portions 6a and 6c, and a resonator 6b. The resulting device is shown in FIG. 3(f).

Referring now to FIG. 3(g), the surface of the device is covered with a resist 7 at a reduced pressure such that resist 7 fills cleavages 6. Selected areas of the upper surfaces of separated portions 6a and 6c which have not been covered by resist 7 are exposed to form reflective surfaces.

Figure 3H:
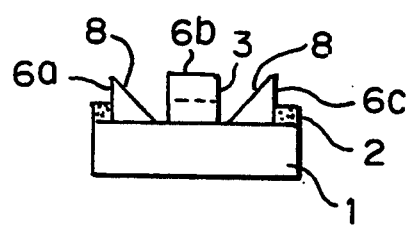

Referring now to FIG. 3(h), the exposed portions of separated portions 6a and 6c are subjected to anisotropic etching to form mirror planes 8. In the preferred embodiment of the invention, mirror planes 8 are formed at an angle of 45 degrees to substrate 1, thereby enabling laser beams 10, emanating from resonator 6b parallel to substrate 1, to exit the device perpendicular to substrate 1.

Referring now to FIG. 1b, resist 7 is removed and metal electrode 11 is connected to wire bond electrode 11a at the top surface of resonator 6b. Wire 11b is connected to an external power supply (not shown). Lower metal electrode 11 is also connected to the same external power supply. Current between the upper and lower wire electrodes excites the resonator.

Referring now to FIGS. 6 and 1b when in a spontaneous emission range 21a, current has a small value as shown by C1, and a broad-spectrum non-laser output emission takes place. At a current value C2 in an intermediate emission current range 21b, the spectrum of light begins to change into a plurality of discrete line spectra. A further increase in current beyond the value of C2 shifts the operation into a stimulated emissions range 21c. The spectrum narrows into one dominant wavelength, thereby generating laser beams 10 which emanate from resonator surfaces 9 and reflect off mirror planes 8.

Figure 7:
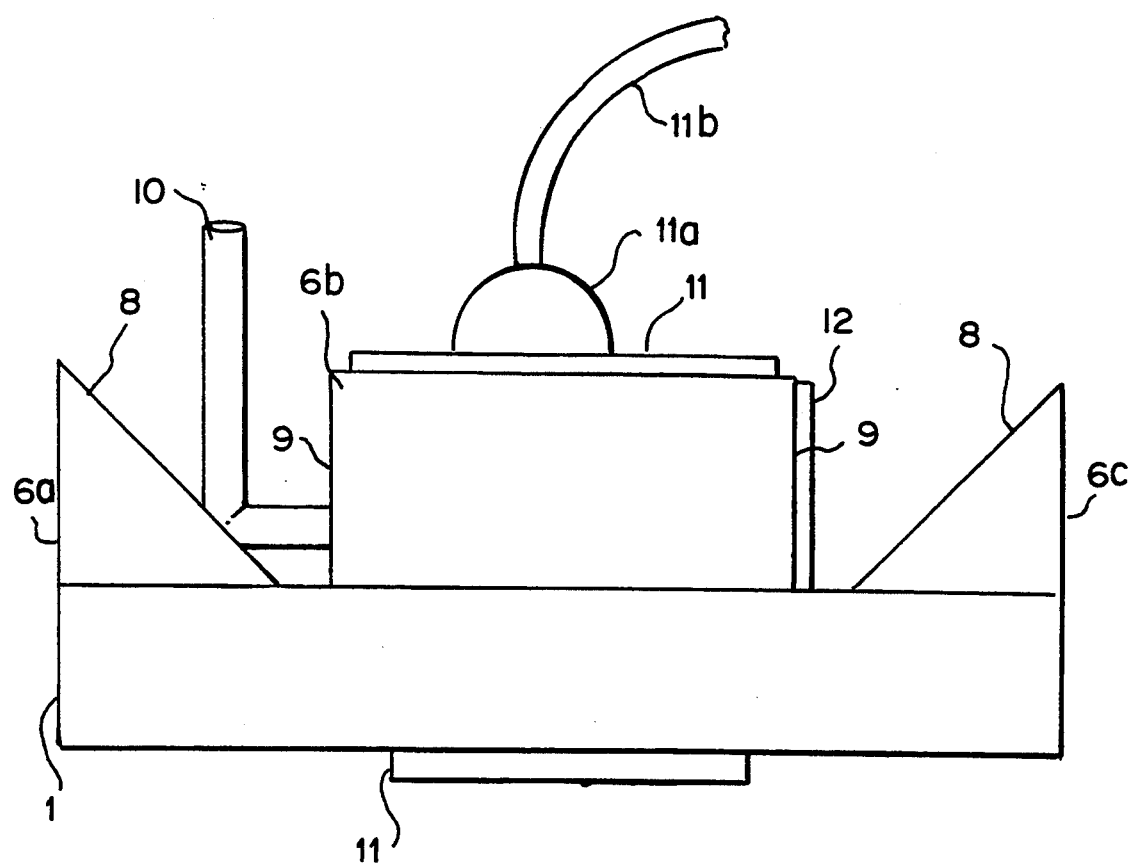
FIG. 7 is a side view of the present invention.

In the preferred embodiment, two laser beams 10 are generated. If desired, however, the laser can be limited to a single beam by covering one of resonator surfaces 9 with a metal layer 12, as shown in FIG. 7, which provides 100% reflection with resonator surface 9. As a result, the etching process for forming a mirror surface can be limited to only one separated portion.

The average length of a laser resonator formed employing conventional methods is 200–400 μ. At this size, it is difficult to form cleavages of sufficient accuracy while still obtaining the optimum resonator length. According to the present invention, however, cleavages with submicron dimensions can be formed using photolithography. Thus the present invention realizes accuracy in size as well as an optimum resonator length.

To construct a laser array, the cleavage surfaces of the separated portions are subject to anisotropic etching to form 45 degree mirror planes.

In the above cases, the mirror planes of the resonator can be formed with an accuracy to the submicron order by using the selective growth technique and cleavage methods, while the direction of a laser beam can be reflected by 45 degree mirror planes formed through anisotropic etching. As a result, an array of semiconductor laser devices with high performance can be easily constructed.

The angles at which laser beams 10 emanate from the semiconductor laser device are not limited to right angles, i.e., 90 degrees, to the substrate. Any desired direction can be selected by adjusting the anisotropic etching to form mirror planes of the desired angle.

Although the preferred embodiments employ layers 3a–3c in resonator 6b to form a pin diode, other combinations of layers may be used without departing from either the scope or spirit of the invention.

The present invention may be used for growing III-V group, II-VI group, III-V group, II-VI group, or III-V group compound semiconductor on a substrate without departing from the scope or spirit of the invention as defined in the appended claims. In the preferred embodiment above, the substrate is silicon. Other substrate materials such as, for example, ruby or diamond, can be substituted for silicon without departing from the spirit and scope of the invention. Furthermore, the scope of the present invention is not limited to homoepitaxial or heteroepitaxial growth.

Having described the preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor laser device comprising:
   a substrate;
   a semiconductor film on said substrate having a plurality of layers, each of said layers substantially parallel to said substrate;
   said plurality of layers having a laser excitation layer;
   two cleavages defining first and second cleaved ends in said semiconductor film;
   said first and second cleaved ends dividing said semiconductor film into a resonator, having said first and second cleaved ends at opposed ends thereof, and at least one separated portion adjacent to said resonator;
   said first and second cleaved ends being parallel to each other and spaced apart a distance effective to define said resonator for permitting laser activity within said semiconductor film;
   said laser excitation layer being effective for emitting at least on beam from said first and second cleaved ends in response to an excitation;
   a mirror plane on said at least one separated portion facing one of said first and second cleaved ends;
   said mirror plane being reflective and disposed at an angle with respect to a line perpendicular to said first and second cleaved ends;
   said angle being effective for reflecting said at least one beam between said line and a location off said substrate in a desired direction; and
   means for exciting said laser excitation layer.

2. A semiconductor laser device according to claim 1, wherein said angle is 45 degrees.

3. A semiconductor laser device according to claim 1, wherein said plurality of layers form a pin diode.

4. A semiconductor laser device according to claim 1 wherein said semiconductor film includes at least one diffusion layer for increasing a current density of said film and reducing a threshold voltage of said laser excitation layer.

5. A semiconductor laser device according to claim 1 further comprising a layer of metal covering one of said first and second cleaved ends, said layer of metal being effective for blocking laser emission.

6. A semiconductor laser device comprising:
   a substrate;
   a semiconductor film on said substrate having a plurality of layers effective for forming a laser excitation layer;
   said laser excitation layer being effective for producing at least one beam of light;
   means for causing first and second stress risers in said semiconductor film wherein said stress risers form cleaved ends defining a cavity length of said laser;
   said film including means for fracturing at said stress risers in response to rapid cooling whereby a first, second and third semiconductor film portions are formed;
   said first and second semiconductor film portions being separated by a first cleavage;
   said second and third semiconductor film portions being separated by a second cleavage;
   said second semiconductor film portion being a laser resonator defined by first and second cleavage planes at ends thereof;
   etched first and second mirror planes on said first and third semiconductor film portions facing said first and second cleavage planes, respectively for reflecting said at least one beam of light; and
   said resonator being disposed between said first and second mirror planes such that said at least one beam of light emitted from said laser excitation layer reflects off one of said first and second mirror planes.

7. A semiconductor laser device according to claim 6, wherein said first and second angular mirror planes are at 45 degree angles to said substrate.

8. A semiconductor laser device according to claim 6, wherein said beam of light is a laser beam.

9. A semiconductor laser device according to claim 6 wherein said semiconductor film includes at least one diffusion layer for increasing a current density of said film and reducing a threshold voltage of said laser excitation layer.

10. A semiconductor laser device according to claim 6, wherein one of said ends of said second semiconductor film portion has a metal layer covering said one of said ends, whereby said metal layer blocks one said beam of light.

11. A semiconductor laser device according to claim 6, wherein said plurality of layers form a pin diode.

12. An intermediate product of a semiconductor laser device comprising:
a substrate;
a mask on a semiconductor substrate having a window for exposing a portion of said substrate;
at least one stress riser in said window;
a semiconductor film over said window in contact with said at least one stress riser; and
said at least one stress riser being effective for fracturing said semiconductor film during rapid cooling.

13. A method for producing an intermediate product useful for producing a semiconductor laser device, comprising:
forming a mask on a semiconductor substrate;
cutting a window out of said mask for exposing a portion of said substrate and leaving at least one stress riser in an edge of said window;
growing a semiconductor film having a plurality of layers over said portion of said substrate in said window in contact with said at least one stress riser; and
said semiconductor film having a property effective to produce a fracture forming a cleavage plane at said at least one stress riser during rapid cooling thereof.

* * * * *